US012584801B2

(12) United States Patent
Du et al.

(10) Patent No.: US 12,584,801 B2
(45) Date of Patent: Mar. 24, 2026

(54) SEMICONDUCTOR DEVICE AND METHOD OF DETERMINING TEMPERATURE OF SEMICONDUCTOR DEVICE

(71) Applicant: Taiwan Semiconductor Manufacturing Company, Ltd., Hsinchu (TW)

(72) Inventors: Sin-I Du, Hsinchu County (TW); Sui-An Yen, Taipei City (TW); Chih-Pin Hung, Hsinchu City (TW); Chang-Yu Huang, Hsinchu County (TW); Chung-Liang Cheng, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 826 days.

(21) Appl. No.: 17/880,672

(22) Filed: Aug. 4, 2022

(65) Prior Publication Data

US 2024/0044720 A1     Feb. 8, 2024

(51) Int. Cl.
| | |
|---|---|
| *H01L 23/34* | (2006.01) |
| *G01K 7/18* | (2006.01) |
| *G01K 7/22* | (2006.01) |
| *H10D 1/47* | (2025.01) |

(52) U.S. Cl.
CPC ............. *G01K 7/226* (2013.01); *G01K 7/186* (2013.01); *H01L 23/34* (2013.01); *H10D 1/47* (2025.01)

(58) Field of Classification Search
CPC .......... G01K 7/226; G01K 7/186; G01K 7/24; H01L 23/34; H10D 1/47
See application file for complete search history.

(56) References Cited

U.S. PATENT DOCUMENTS

| | | | |
|---|---|---|---|
| 2003/0067344 A1* | 4/2003 | Nanba ....................... | G01K 7/24 |
| | | | 374/E7.031 |
| 2017/0176263 A1* | 6/2017 | Chen ....................... | G01K 7/226 |
| 2019/0304915 A1* | 10/2019 | Jain ........................ | H01L 23/147 |
| 2020/0076409 A1* | 3/2020 | Hashimoto ............ | H03K 3/011 |
| 2022/0090968 A1* | 3/2022 | Hong .................... | G06F 3/0412 |
| 2023/0358618 A1* | 11/2023 | Horng ....................... | G01K 7/24 |

* cited by examiner

*Primary Examiner* — John E Breene
*Assistant Examiner* — Manuel Salvador Castellon, Jr.
(74) *Attorney, Agent, or Firm* — JCIPRNET

(57) ABSTRACT

A semiconductor device includes a first substrate and a first device layer. The first device layer is disposed on the first substrate and includes a first region and a second region of the first device layer. The first device layer includes at least one first device and a sensor aside the at least one first device. The sensor includes a first resistor with a first non-linear temperature resistance curve and a second resistor with a second non-linear temperature resistance curve. A temperature of the sensor is linearly related to a difference between a first resistance of the first resistor at the temperature and a second resistance of the second resistor at the temperature.

20 Claims, 11 Drawing Sheets

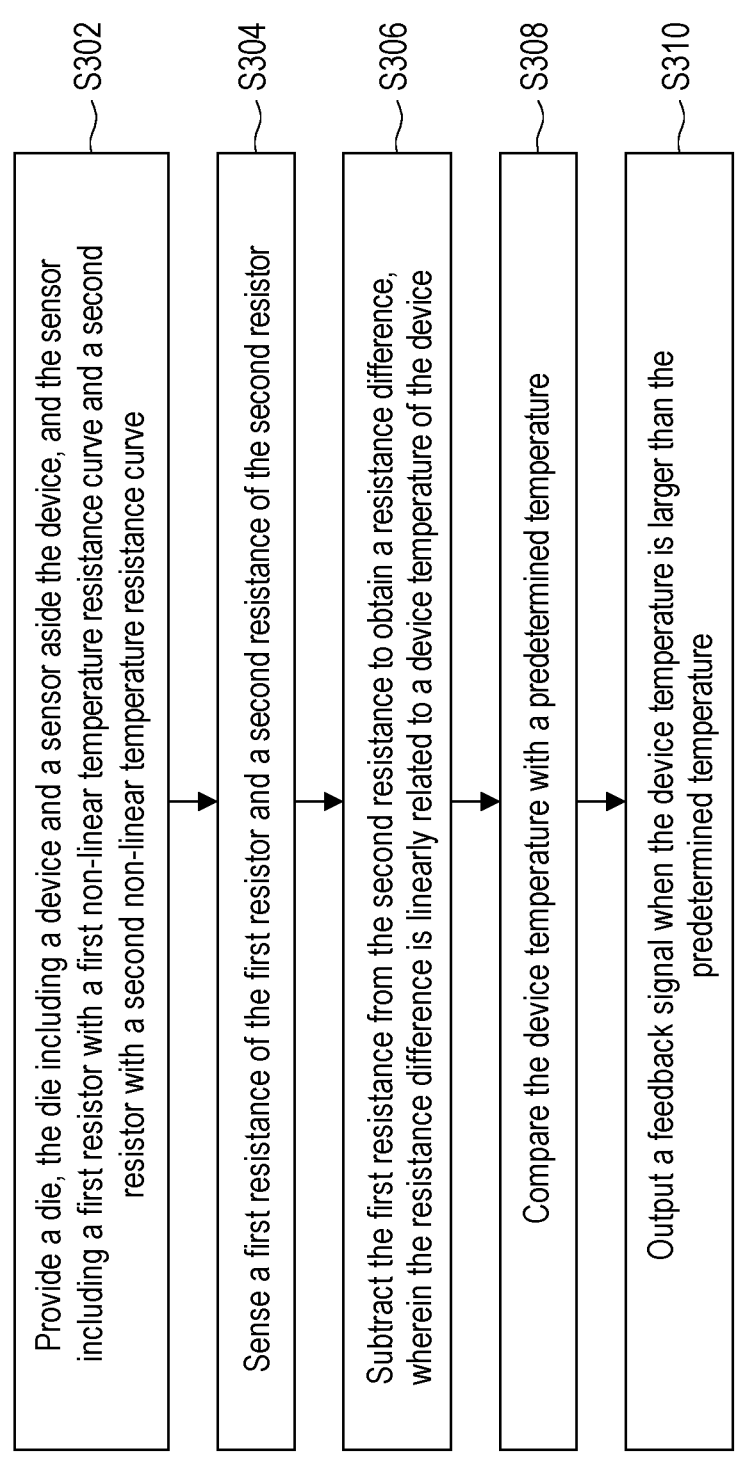

Provide a die, the die including a device and a sensor aside the device, and the sensor including a first resistor with a first non-linear temperature resistance curve and a second resistor with a second non-linear temperature resistance curve ⌒S302

Sense a first resistance of the first resistor and a second resistance of the second resistor ⌒S304

Subtract the first resistance from the second resistance to obtain a resistance difference, wherein the resistance difference is linearly related to a device temperature of the device ⌒S306

Compare the device temperature with a predetermined temperature ⌒S308

Output a feedback signal when the device temperature is larger than the predetermined temperature ⌒S310

FIG. 6

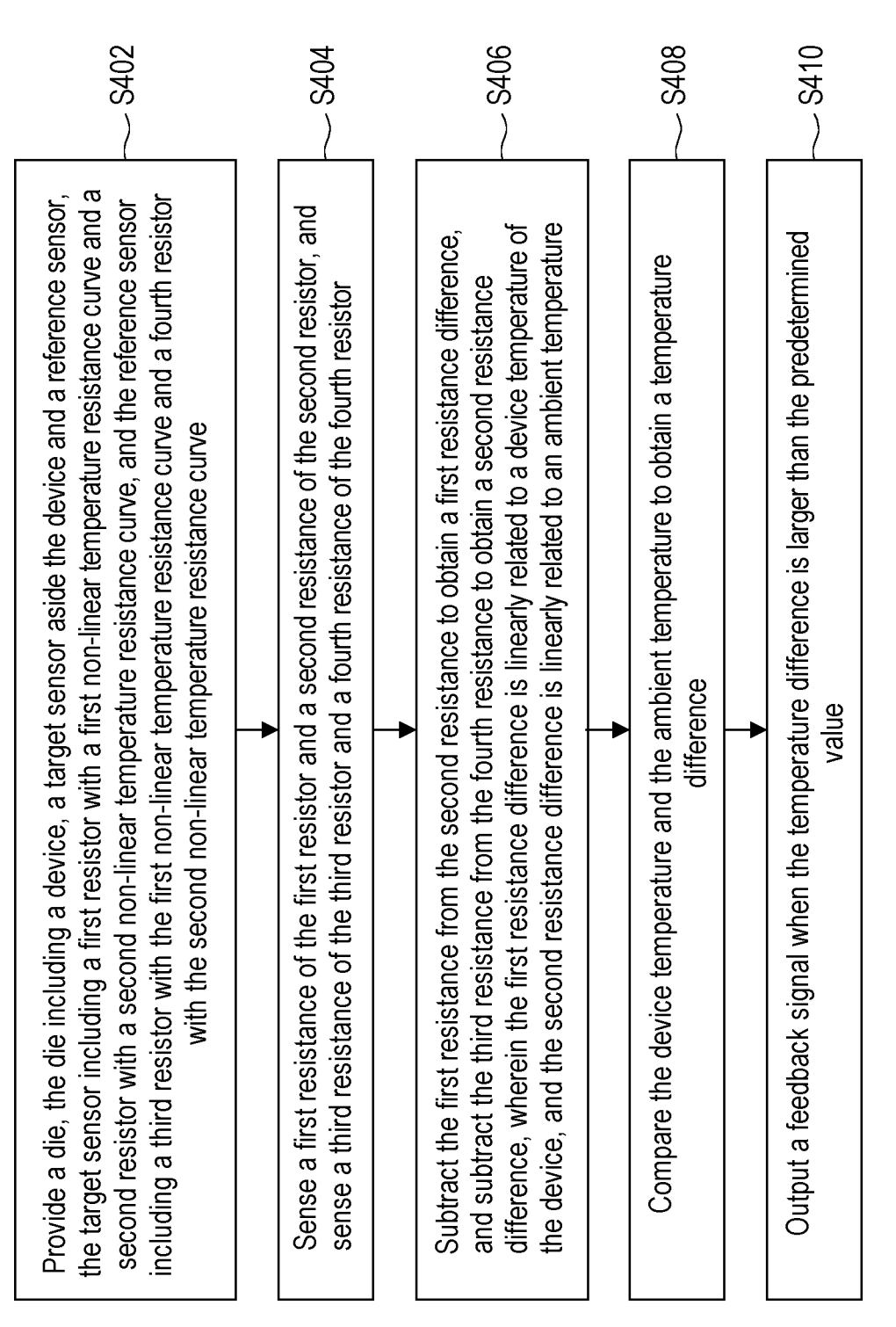

Provide a die, the die including a device, a target sensor aside the device and a reference sensor, the target sensor including a first resistor with a first non-linear temperature resistance curve and a second resistor with a second non-linear temperature resistance curve, and the reference sensor including a third resistor with the first non-linear temperature resistance curve and a fourth resistor with the second non-linear temperature resistance curve — S402

Sense a first resistance of the first resistor and a second resistance of the second resistor, and sense a third resistance of the third resistor and a fourth resistance of the fourth resistor — S404

Subtract the first resistance from the second resistance to obtain a first resistance difference, and subtract the third resistance from the fourth resistance to obtain a second resistance difference, wherein the first resistance difference is linearly related to a device temperature of the device, and the second resistance difference is linearly related to an ambient temperature — S406

Compare the device temperature and the ambient temperature to obtain a temperature difference — S408

Output a feedback signal when the temperature difference is larger than the predetermined value — S410

SEMICONDUCTOR DEVICE AND METHOD OF DETERMINING TEMPERATURE OF SEMICONDUCTOR DEVICE

BACKGROUND

Since there are fast growing numbers of transistors in 2.5D-ICs or 3D-ICs, stacking multiple dies faces a severe challenge of thermal effect due to the low thermal conductivity of inter-layer dielectrics and high power-density. This situation constrained the complexity and performance of the designed circuits.

For interconnection scalability from layer to layer, 3D fabrics are a necessity. Meanwhile, the high packing density of the stacked dies also hampers the heat dissipation of the network-on-chip (NoC) system. Power consumptions increase drastically due to the increasing interconnection lengths and the derivatively occurred leakage currents. On the other hand, thermal issues arise from increasing dynamic power losses which in turn raise the temperature. Thermal and power constraints are of great concern with 3D-ICs since die stacking can dramatically increase power density if hotspots overlap each other.

That is, thermal management are critical issues in either 2.5D or 3D stacking design, especially when the hotspots are located or not located next to the heat sink. The real-time temperature performance of the stacked chips can be properly detected for evaluating the local temperature of the 2.5D or 3D package by using suitable thermal detection device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flow diagram illustrating a method of determining a temperature of a semiconductor device.

2

Figure 1:
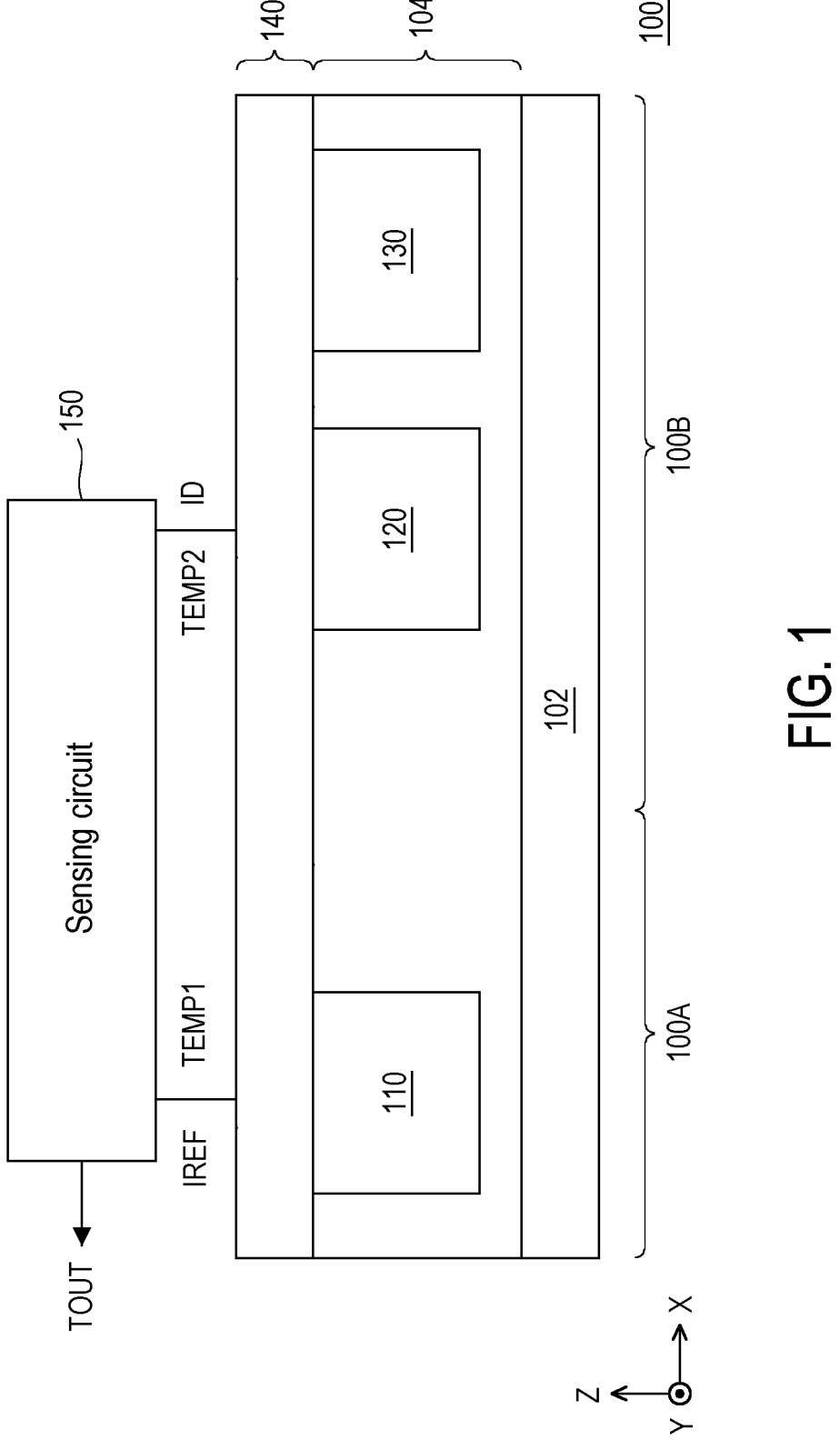
FIG. 1 is a schematic cross-sectional view of a semiconductor die including embedded sensors and logic devices, in accordance with some embodiments.

FIG. 7 is another flow diagram illustrating a method of determining a temperature of a semiconductor device.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

It should be appreciated that the following embodiment(s) of the disclosure provides applicable concepts that can be embodied in a wide variety of specific contexts. The specific embodiment(s) discussed herein is merely illustrative and is related to a semiconductor device including a sensor component (or device) of an ion-sensing transistor disposed in an interconnect formed during back-end-of-line (BEOL) processes, and is not intended to limit the scope of the disclosure. In accordance with some embodiments, one or more than one sensor component (or device) is embedded in an interconnect of the semiconductor device to arrive to a large sensing (or testing) area, where the sensor component (or device) is formed with a thin film transistor (TFT) having a channel of indium gallium zinc oxide (IGZO) with a gate dielectric of a high-k dielectric material. In the case, such thin film transistor is able to formed in the interconnect during the BEOL processes, thus the manufacturing process of the semiconductor device is simplified, thereby lowering the manufacturing cost.

Nowadays, there are types of packages for semiconductors include quad flat pack (QFP), pin grid array (PGA), ball grid array (BGA), flip chips (FC), three-dimensional integrated circuits (3DICs), wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips. However, there are many challenges related to 3DICs.

A thermal control mechanism with an in-situ temperature sensor for 3D-ICs is proposed. By virtue of the temperature sensor, the offset temperatures between the hotspots in the power-thermal domain can be calculated. Therefore, the in-situ temperature sensor is placed near the hotspot to detect the temperature and provides thermal information (e.g., feedback) for the system. Thermal-sensing floorplan in 3D-ICs design is the key as well in which the BEOL interconnects play a role more than just signal transmission or power delivery. For 3D-ICs, the problems of high power/thermal density can be more serious than in the planar form. Thus, thermal sensor for heat control is one solution to overcome the obstacles and continue the performance scaling.

In order to prevent the damage of the device caused by the overheating temperature and to keep the original routing and floorplan as much as possible, thermal detection design should be brought in early phases of the design procedure.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In some embodiments, the manufacturing method is part of a wafer level packaging process. It is to be noted that the process steps described herein cover a portion of the manufacturing processes used to fabricate the semiconductor device involving a semiconductor component such as a semiconductor sensor. The embodiments are intended to provide further explanations but are not used to limit the scope of the disclosure. In the disclosure, it should be appreciated that the illustration of components throughout all figures is schematic and is not in scale.

FIG. 1 is a schematic cross-sectional view of a semiconductor die including embedded sensors and logic devices, in accordance with some embodiments.

Referring to FIG. 1, in some embodiments, a semiconductor die 100 is provided. The semiconductor die 100 may include a substrate 102, a device layer 104 on or in the substrate 102 and an interconnect structure 140. In some embodiments, the substrate 102 includes an elementary semiconductor material such as silicon, germanium, gallium, zinc, indium, oxide, arsenide, nitrogen, and/or phosphorus. and/or a compound semiconductor such as silicon germanium, silicon carbide, gallium arsenic, indium arsenide, gallium nitride, or indium phosphide. In some embodiments, the substrate 102 includes a bulk semiconductor substrate, a crystalline silicon substrate, a doped semiconductor substrate (e.g., p-type semiconductor substrate or n-type semiconductor substrate), a semiconductor-on-insulator (SOI) substrate, or the like. In certain embodiments, the substrate 102 includes one or more doped regions or various types of doped regions, depending on design requirements. In some embodiments, the doped regions are doped with p-type and/or n-type dopants. For example, the p-type dopants are boron or $BF_2$ and the n-type dopants are phosphorus or arsenic. The doped regions may be configured for an n-type metal-oxide-semiconductor (NMOS) transistor or a p-type MOS (PMOS) transistor. The substrate 102 may be a wafer, such as a silicon wafer. Generally, the SOI substrate is a layer of a semiconductor material formed on an insulator layer. The insulator layer is, for example, a buried oxide (BOX) layer, a silicon oxide layer, or the like. Other substrates, such as a multi-layered or gradient substrate may also be used. In some alternative embodiments, the substrate 102 includes a semiconductor substrate made of other suitable elemental semiconductor, such as diamond or germanium; a suitable compound semiconductor, such as gallium arsenide, silicon carbide, gallium phosphide, indium phosphide, indium arsenide and indium antimonide, an alloy semiconductor such as SiGe, GaAsP, AlinAs, AlGaAs, GaInAs, GaInP and GaInAsP or combinations thereof. For example, the substrate 102 is a silicon bulk substrate. In various embodiments, the substrate 102 may take the form of a planar substrate, a substrate with multiple fins, nanowires, or other forms known to people having ordinary skill in the art. In some embodiments, the substrate 102 may have through substrate vias therein upon the process requirements. In some embodiments, a plurality of isolation structures are formed in the substrate 102. In certain embodiments, the isolation structures are trench isolation structures. In other embodiments, the isolation structures include local oxidation of silicon (LOCOS), shallow trench isolation (STI), and deep trench isolation (STI) structures.

Figure 5:
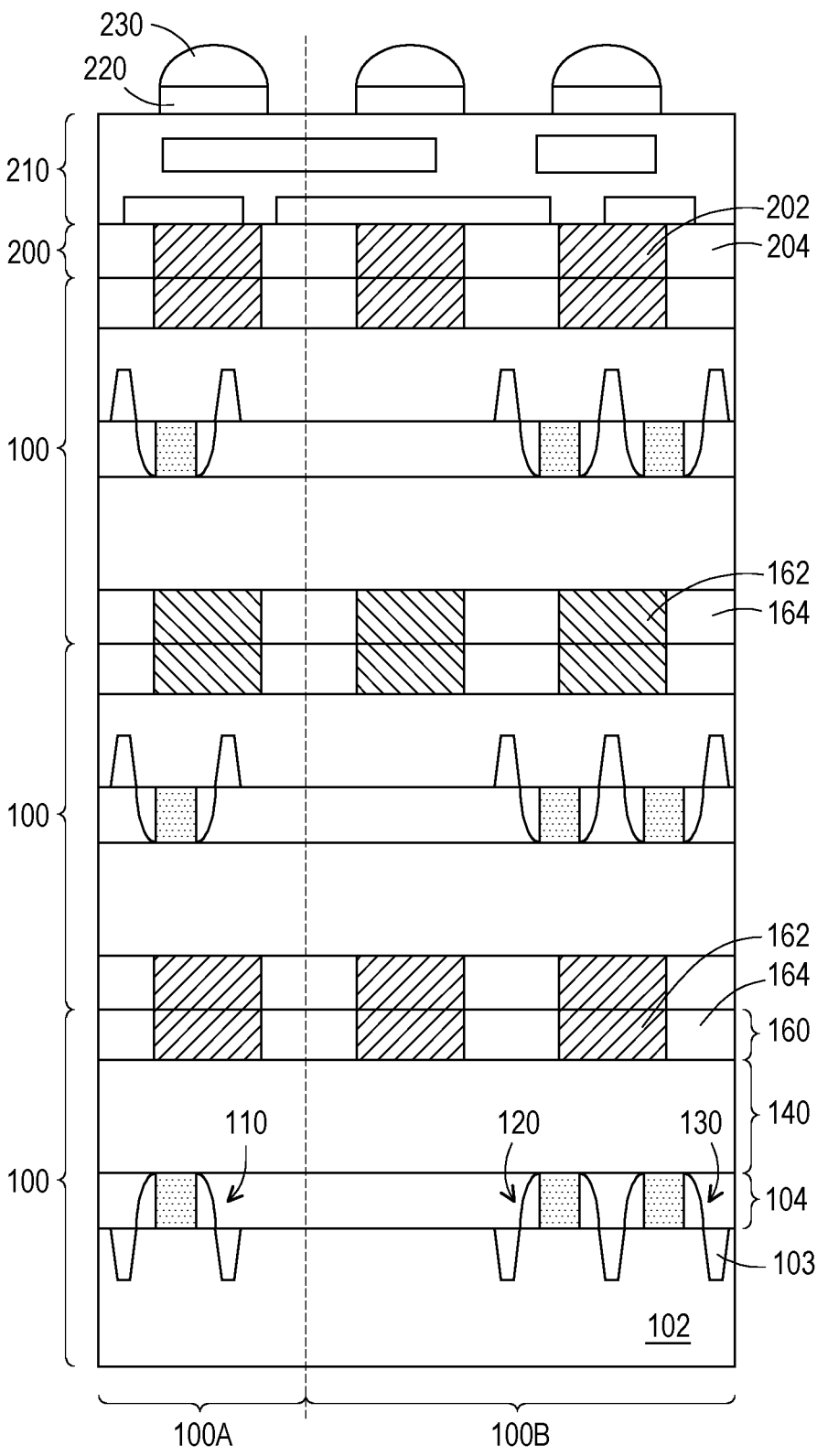
FIG. 5 illustrates a cross-sectional view of a semiconductor package in accordance with some embodiments.

The device layer 104 includes a wide variety of devices such as device 130 and temperature sensors 110, 120. The sensor 110 is disposed in an isolation region 100A, and the sensor 120 and the at least one device 130 are disposed in a device region (or dense region) 100B. The device 130 may include active components, passive components, or a combination thereof. The device 130 may include integrated circuit (IC) or logic devices. For example, the device 130 are transistors such as planer FET, FinFET, GAA-FET and NW-FET, capacitors, resistors, diodes, photodiodes, fuse devices, or other similar devices. The functions of the device 130 may include memory, processors, sensors, amplifiers, power distribution, input/output circuitry, or the like. In some embodiments, the devices (such as the sensor 110, the sensor 120, and the device 130) are formed during the front-end-of-line (FEOL) processes. In one embodiment, the sensor 110, the sensor 120, and the device 130 are formed by the complementary MOS (CMOS) processes. The number and configurations of the devices formed in the device layer 104 should not be limited by the embodiments or drawings of this disclosure. It is understood that the number and configurations of the devices may have different material or configurations depending on product designs. The sensor 110, the sensor 120, and the device 130 may be transistors of the same conductive type or different conductive types (such as PMOS transistors or NMOS transistors), and have structures as shown in FIG. 5, which will be described in detail with reference to FID. 5. Only three devices formed in the device layer 104 are shown in FIG. 1 for illustrative purposes, however the disclosure is not limited thereto. The number of the devices formed in the device layer 104 may be more than three. In other words, each of the sensor 110, the sensor 120, and the device 130 may represent one or multiple transistors. The interconnect structure 140 may establish electrical connection with the device layer 104, to provide terminals for electrical connections to later-formed components (e.g., an interconnect or interconnect structure) or external components. In some embodiments, the interconnect structure 140 includes at least one insulating layer and a plurality of metal features.

The sensor 110, 120 includes two types of resistors (e.g., a first type resistor and a second type resistor) with two impedance matching resistance introduced by the combinational circuits or transistors, and each resistor (e.g., a first type resistor and a second type resistor) has non-linear temperature resistance curve. For example, the non-linear temperature resistance curve is a quadratic curve. The temperature of the sensor 110, 120 is linearly related to a difference between a first resistance of the first type resistor at the temperature and a second resistance of the second type resistor at the temperature. The types and numbers of the resistor are not limited thereto. The first type resistor may be a positive temperature coefficient resistor, and the second type resistor may be a negative temperature coefficient resistor and vice versa. In some embodiments, each resistor has a plurality of resistor elements (e.g., the resistor elements shown in FIG. 2A to FIG. 2D, FIG. 3A to FIG. 3D and FIG. 4A to FIG. 4D) arranged or connected in series and/or in parallel. In some embodiments, the resistor elements may be connected in series-parallel mixed way. The resistor element may be a negative temperature coefficient resistor or a positive temperature coefficient resistor.

Referring to FIG. 1, the sensors 110 and 120 may be composed of combinational circuits. For example, the combinational circuits (or logic gates) may be subtracting circuits, multiplier, feedback circuits, amplifier circuits, registers, processing circuits, temperature adjusting circuits, switching circuits, proportional-to-absolute-temperature (PTAT) circuits, negative-to-absolute-temperature (NTAT) circuits, band-gap circuits, temperature compensation circuits, etc. In some embodiments, the logic circuits include at least one transistor. The disclosure of the logic circuits is not limited thereto. In alternative embodiments, the sensor 110 and the sensor 120 may have the same structure or circuit. The type and structures of the combinational circuits in the embodiment is not limit herein. The sensors 110 and 120 are configured to sense at least two types of the equivalence resistances under certain temperatures provided by the combinational circuits. That is, each sensor 110, 120 has two types of the equivalence resistances provided by the combinational circuits. In addition, the equivalence resistances of the sensors 110 and 120 are temperature dependent and the two types of the equivalence resistances are impedance matching with each other at room temperature. The term "impedance matching" is defined as the process of designing one impedance (or resistance) substantially equals to another impedance to minimize the signal reflection or maximize the power transfer of the load. Each equivalence resistances are nonlinearly related to the temperature. In some embodiments, a temperature resistance curve of the equivalent resistance of the sensor 110 (or the sensor 120) may be a quadratic curve.

For example, the sensor 110 senses two types of in-situ resistances (i.e., the resistances introduced by the combinational circuits embedded in the sensor) at the background temperature (or the ambient temperature) TEMP1 (i.e., a temperature of the circumstance or a temperature of the specific device layer) and outputted a current IREF to a sensing circuit 150 through the interconnect structure 140. Similarly, the sensor 120 senses two types of in-situ resistances at an operation temperature TEMP2 of the device 130 (i.e., a device temperature that the device 130 is in active mode) and outputted a current ID to the sensing circuit 150 through the interconnect structure 140. In some embodiments, the sensing circuit 150 is a current sensing circuit, and the sensing circuit 150 is used to detect a current drop from the sensors 110, 120 while the at least one semiconductor logic device 130 is in an active mode. The sensing circuit 150 compares the current IREF corresponding to the background temperature TEMP1 outputted by the sensor 110 with the current ID outputted by the sensor 120 corresponding to the device temperature TEMP1 of the device 130, and then outputs a compared result TOUT. In other words, when the value of the compared result TOUT is larger than a predetermined temperature range, the device 130 may be considered as overheating. The predetermined temperature range may be adjusted according to the requirements.

Figure 2A:
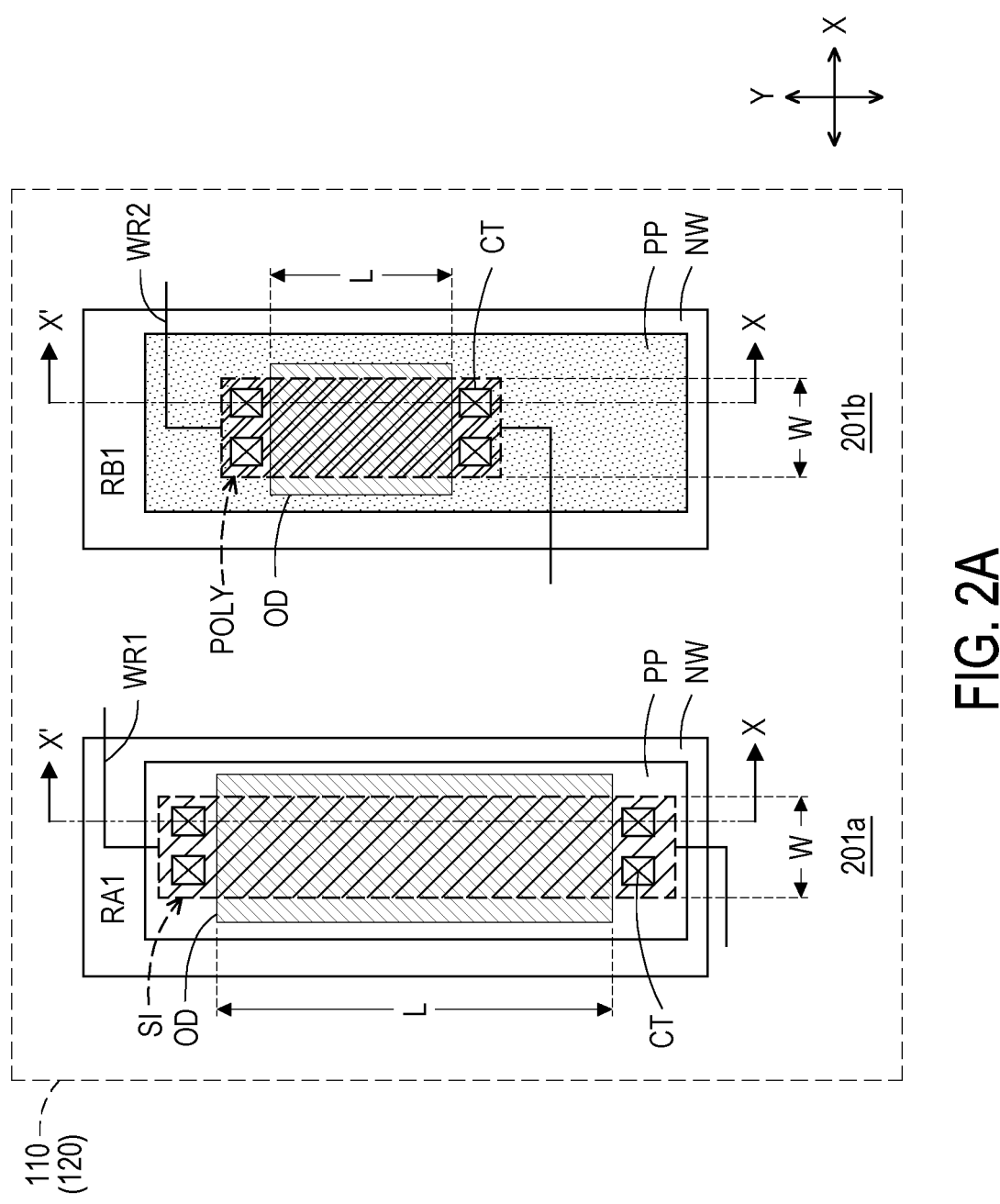
FIG. 2A and FIG. 2B respectively illustrate a schematic top view of an equivalent resistance layout of the sensors in accordance with some embodiments of the disclosure.
Figure 2B:
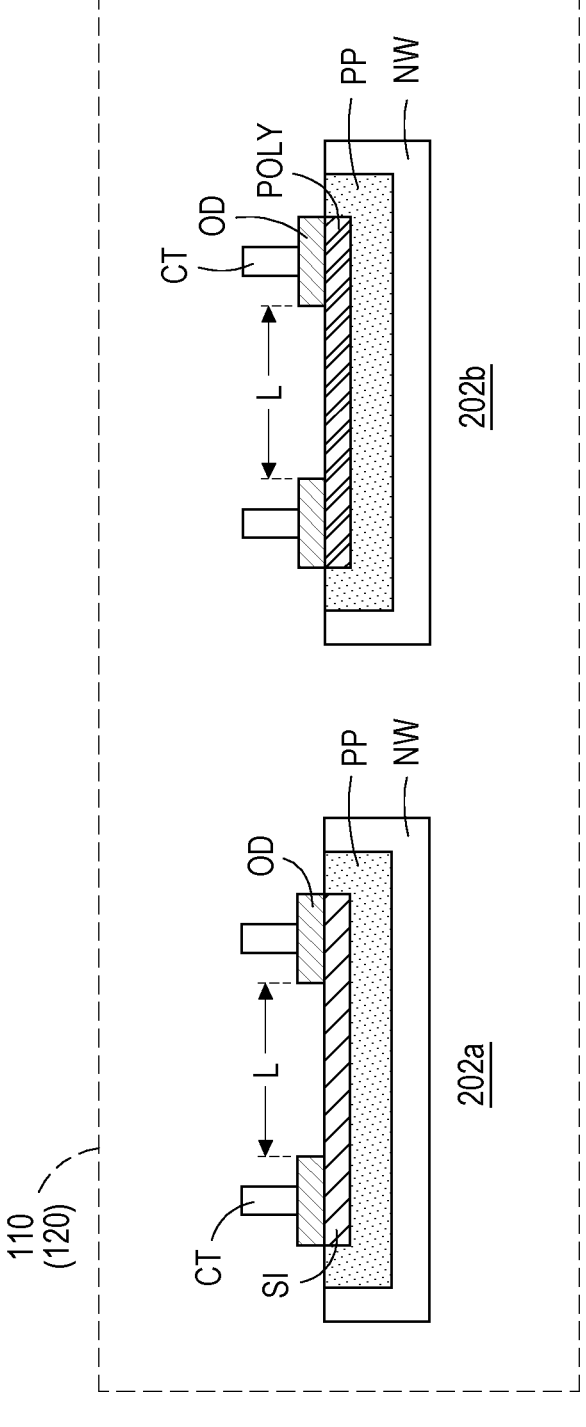
Figure 2E:
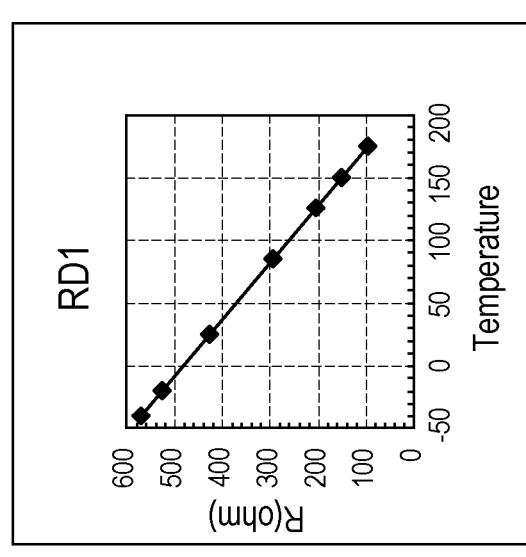
FIG. 2C to 2E respectively illustrate temperature resistance curves of the two types of the resistors, in accordance with some embodiments of the disclosure.
Figure 2D:
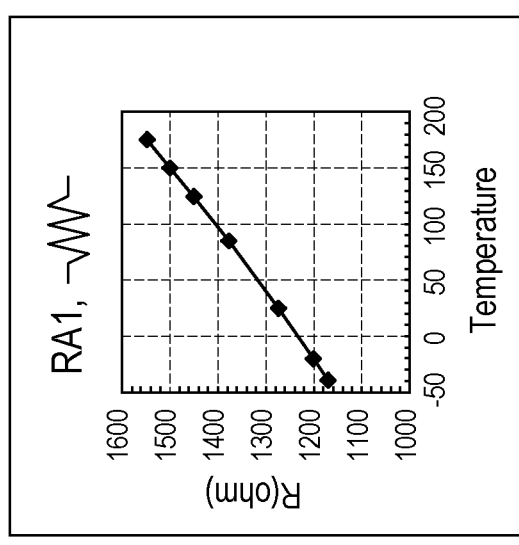
Figure 2C:
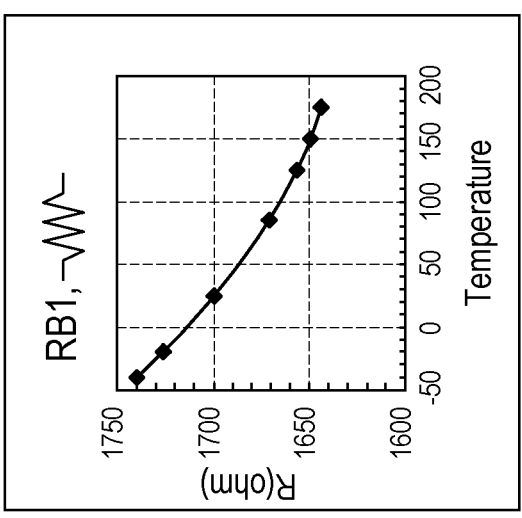

FIG. 2A and FIG. 2B respectively illustrate a schematic top view of an equivalent resistance layout of the sensors in accordance with some embodiments of the disclosure. The schematic cross-sectional views 202a and 202b of FIG. 2B are taken along a dash-line X-X' depicted in the schematic top plane view of the equivalent resistance layout of the sensor 201a and 201b in FIG. 2A. FIG. 2C to 2E respectively illustrate temperature resistance curves of the two types of the resistors, in accordance with some embodiments of the disclosure.

Referring to FIGS. 2A and 2B, according to some embodiments, the sensor 110 and the sensor 120 both have at least two types of the equivalent resistances RA1 and RB1 introduced by the combinational circuits (not shown). For example, the in-situ equivalent resistances RA1 and RB1 introduced by the combinational circuits are sensed by the sensor 110 (or the sensor 120), separately. In some embodiments, the equivalent resistances RA1 and RB1 of the sensor 110 and the equivalent resistances RA1 and RB1 of the sensor 120 are of the same type. In other words, the two resistor types of the sensor 110 are the same as the two resistor types of the sensor 120, respectively. In accordance with some embodiments, the in-situ equivalent resistances RA1 and RB1 may be integrated or connected in various ways. For example, the sensor 110 (or the sensor 120) has a single resistor having equivalent resistance RA1 and a single resistor having equivalent resistance RB1 combined together, wherein the equivalent resistance RA1 and the equivalent resistance RB1 are impedance matched. Therefore, the linear relationship of the resistance versus temperature curve is able to be achieved by subtracting the equivalent resistance RA1 from equivalent resistance RB1. Thus, the non-linear terms in the resistance versus temperature curve of the equivalent resistance RB1 and the equivalent resistance RA1 is able to be canceled. In other words, the resistance difference between the equivalent resistance RA1 and the equivalent resistance RB1 is linearly related to the temperature. For example, the sensor 110 (or the sensor 120) senses the equivalent resistance RA1 and the equivalent resistance RB1 of the combinational circuits, executes the subtracting operation by the internal circuits in the sensor, for example, subtract circuits (not shown), receives the resistance difference, and transforms the resistance difference corresponding to the temperature into an output current. Further, the sensing circuit is able to receive the output current and determine the temperature according to the temperature-related resistance difference, wherein the resistance difference is linearly related to the temperature, making temperature detection more easily and fast.

Referring to FIG. 2A, in some embodiments, the top view layout 201a of the first type resistor having the equivalent resistance RA1 and the top view layout 201b of the second type resistor having the equivalent resistance RB1 of the sensor 110 (or the sensor 120) are provided. As shown in FIG. 2A and FIG. 2B, the first type resistor structure 202a, having the first equivalent resistance RA1, may include an N-well region NW, a P-plus region PP, the silicide region SI, the oxide diffusion region OD, and a plurality of contact regions CT. The second type resistor structure 202b, having the second equivalent resistance RB1, may include an N-well region NW, a P-plus region PP, a poly-silicon region POLY, the oxide diffusion region OD, and a plurality of contact regions CT. The equivalent resistance RA1 is electrically connected to a wire WR1 depicted in FIG. 2A, and the equivalent resistance RB1 is electrically connected to a wire WR2 depicted in FIG. 2A, for example.

Referring to FIG. 2A, in some embodiments, a length L (for example, gate length) of the first type resistor structure 202a of the layout 201a is substantially equal to 9 μm. A width W (for example, gate width) of the first type resistor structure 202a of the layout 201a may be substantially equal to 1.8 μm. A length L (for example, gate length) of the second type resistor structure 202b in the layout 201b may be substantially equal to 3.6 μm. A width W (for example, gate width) of the first type resistor structure 202a in the layout 201a may be substantially equal to 1.8 μm. However, the disclosure is not limited thereto. In some embodiments, by virtue of the width-over-length ratio (i.e., W/L) design in FIG. 2A, the equivalent resistance RA1 and the equivalent resistance RB1 are impedance matched, making the measured resistance difference less disturbed.

Referring to FIG. 2C to FIG. 2E, in some embodiments, a temperature resistance curve of the equivalent resistance RB1, a temperature resistance curve of the equivalent resistance RA1, and a temperature resistance curve of the resistance difference RD1 provided by subtracting the equivalent resistance RA1 from the equivalent resistance RB1 is provided. As shown in FIG. 2C to FIG. 2E, the temperature resistance curve of the equivalent resistance RB1 and the temperature resistance curve of the equivalent resistance RA1 are non-linear curves, for instance, quadratic curves. The order of the nonlinear curve is related to the characteristic of different kinds of resistors. However, in the temperature resistance curve of the resistance difference RD1, the resistance difference RD1 is linearly related to the temperature, so as the temperature detection can be easily determined by the linear equation of the linear curve. In some embodiments, the resistor structure of FIG. 2C is a negative temperature coefficient resistor, the resistor structure of FIG. 2D is a positive temperature coefficient resistor, and the equivalent resistor structure of FIG. 2E is a negative temperature coefficient resistor. However, the disclosure is not limited thereto.

Figure 3A:
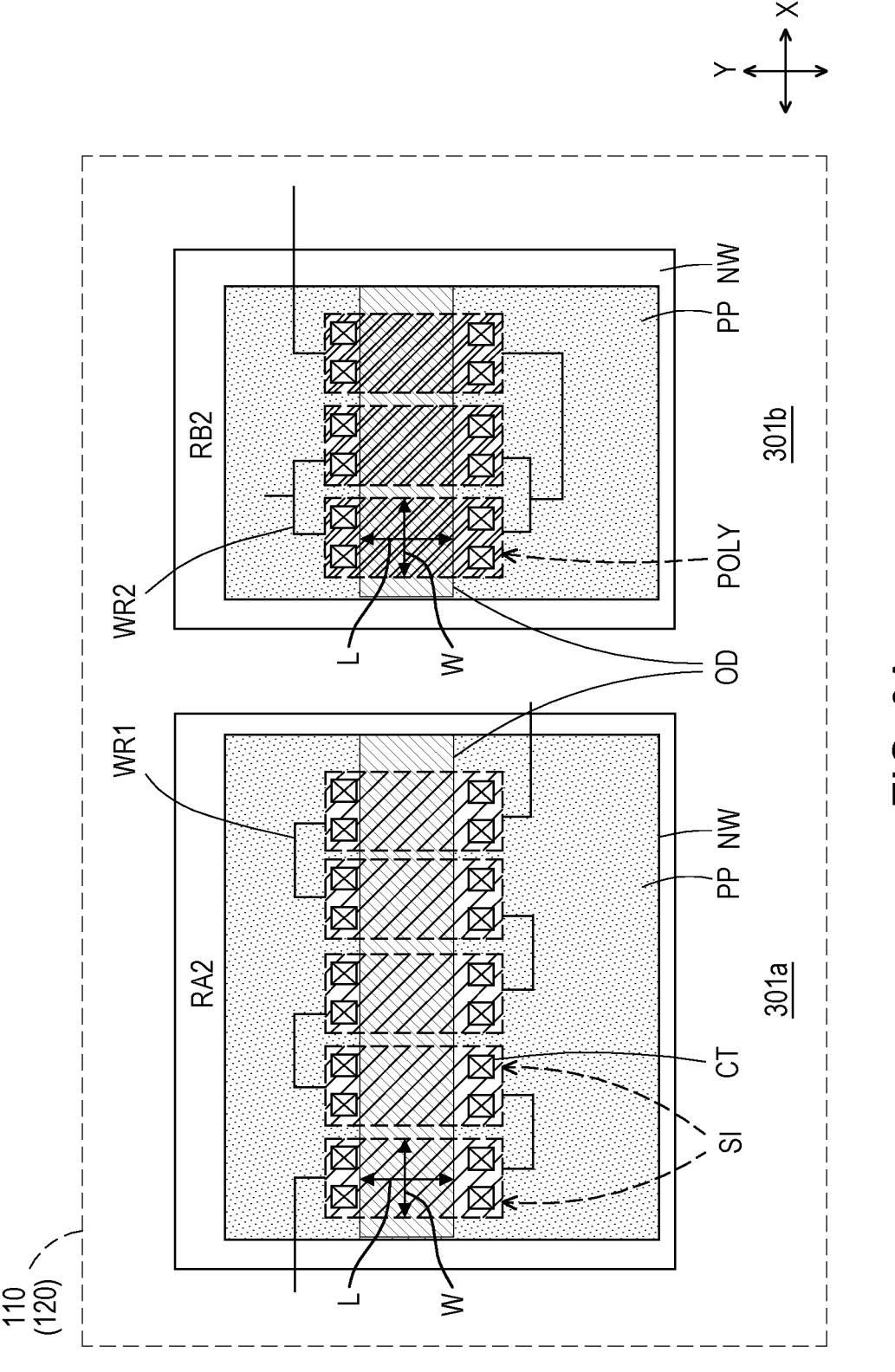
FIG. 3A illustrates a schematic top view of another equivalent resistance layout of the sensors in accordance with some alternative embodiments of the disclosure.
Figure 3D:
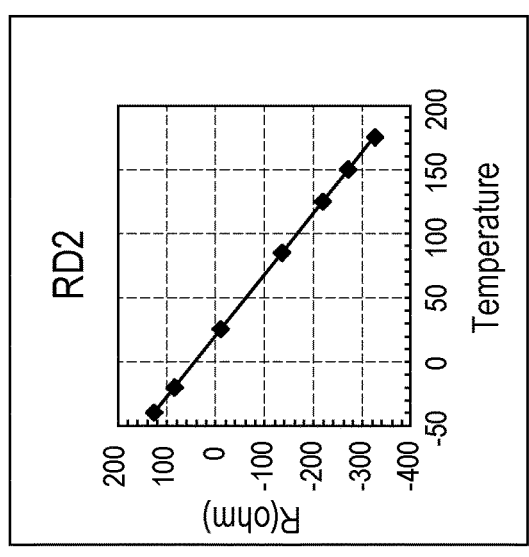
FIG. 3B to 3D respectively illustrate temperature resistance curves of the two types of the resistors, in accordance with some embodiments of the disclosure.
Figure 3C:
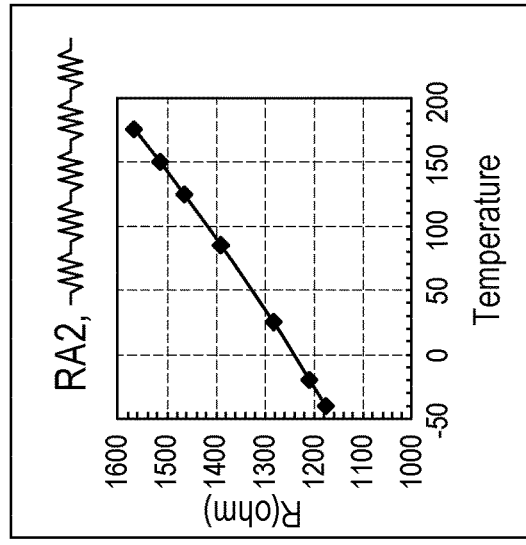
Figure 3B:
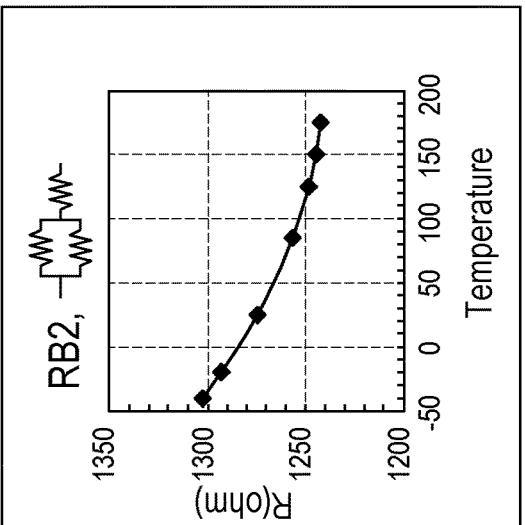

FIG. 3A illustrates a schematic top view of another equivalent resistance layout of the sensors in accordance with some alternative embodiments of the disclosure. FIG. 3B to 3D respectively illustrate temperature resistance curves of the two types of the resistors, in accordance with some embodiments of the disclosure.

Referring to FIG. 3A, according to another embodiment, the sensor 110 and the sensor 120 both have at least two types of the equivalent resistances RA2 and RB2 introduced by the combinational circuits (not shown). In accordance with some embodiments, the combinational circuits may be equivalent to a plurality of resistor elements. The resistor elements may be electrically connected by the wires WR1, WR2 in the physical design layout 301a, 301b in various ways, for example, serially connected, parallel connected, or serial-parallel mixed connected. In some embodiments, the connected number of the resistor elements by the wires WR1, WR2 is not limited. The equivalent resistance RA2 and the equivalent resistance RB2 formed by the resistor elements may be different. For example, as shown in FIG.

3A to FIG. 3C, the equivalent resistance RA2 is composed by five resistor elements connected in series. The equivalent resistance RB2 may have three resistor elements that two of the resistor elements are connected in parallel, and the parallel connected two resistors elements are connected to the other resistor element in series. The equivalent resistance RA2 and the equivalent resistance RB2 are impedance matching. Therefore, the linear relationship of the resistance versus temperature curve is able to be achieved by subtracting the equivalent resistance RA2 from equivalent resistance RB2. Thus, the non-linear terms in the resistance versus temperature curve of the equivalent resistance RB2 and the equivalent resistance RA2 is able to be canceled. In other words, the resistance difference RD2 between the equivalent resistance RA2 and the equivalent resistance RB2 is linearly related to the temperature. For example, the sensor 110 (or the sensor 120) senses the equivalent resistance RA2 and the equivalent resistance RB2 of the combinational circuits, executes the subtracting operation, receives the resistance difference RD2, and transforms the resistance difference RD2 corresponding to the temperature into an output current. Further, the sensing circuit is able to receive the output current and determine the temperature according to the temperature-related resistance difference, wherein the resistance difference is linearly related to the temperature, making temperature detection easier and faster.

Referring to FIG. 3A, in some embodiments, the top view layout 301a of the first type resistor having the equivalent resistance RA2 and the top view layout 301b of the second type resistor having the equivalent resistance RB2 of the sensor 110 (or the sensor 120) are provided. The layout of the first type resistor 301a, having the first equivalent resistance RA2, may include an N-well region NW, a P-plus region PP, the silicide region SI, the oxide diffusion region OD, and a plurality of contact regions CT. The second type resistor, having the second equivalent resistance RB2, may include an N-well region NW, a P-plus region PP, the poly-silicon region POLY, the oxide diffusion region OD, and a plurality of contact regions CT. The resistor elements are electrically connected in series to a wire WR1 depicted in FIG. 3A, and the resistor elements is electrically connected in parallel and then in series to a wire WR2 depicted in FIG. 3A.

Referring to FIG. 3A and FIG. 3B, in some embodiments, a length L (for example, gate length) in the layout 301a is substantially equal to 40 μm. A width W (for example, gate width) in the layout 301a may be substantially equal to 40 μm. A length L (for example, gate length) in the layout 301b may be substantially equal to 40 μm. A width W (for example, gate width) in the layout 201a may be substantially equal to 40 μm. However, the disclosure is not limited thereto. In some embodiments, by virtue of the width-over-length ratio (i.e., W/L) design in FIG. 3A, the equivalent resistance RA2 and the equivalent resistance RB2 are impedance matched, making the measured resistance difference less disturbed.

Referring to FIG. 3B to FIG. 3D, in some embodiments, a temperature resistance curve of the equivalent resistance RB2, a temperature resistance curve of the equivalent resistance RA2, and a temperature resistance curve of the resistance difference RD2 provided by subtracting the equivalent resistance RA2 from the equivalent resistance RB2 is provided. As shown in FIG. 3B to FIG. 3D, the temperature resistance curve of the equivalent resistance RB2 and the temperature resistance curve of the equivalent resistance RA2 are non-linear curves, for instance, quadratic curves. The order of the nonlinear curve is related to the characteristic of different kinds of resistors. However, in the temperature resistance curve of the resistance difference RD2, the resistance difference RD2 is linearly related to the temperature, so as the temperature detection can be easily determined by the linear equation of the linear curve. In some embodiments, the resistor structure of FIG. 3B is a negative temperature coefficient resistor, the resistor structure of FIG. 3C is a positive temperature coefficient resistor, and the equivalent resistor structure of FIG. 3D is a negative temperature coefficient resistor.

Figure 4A:
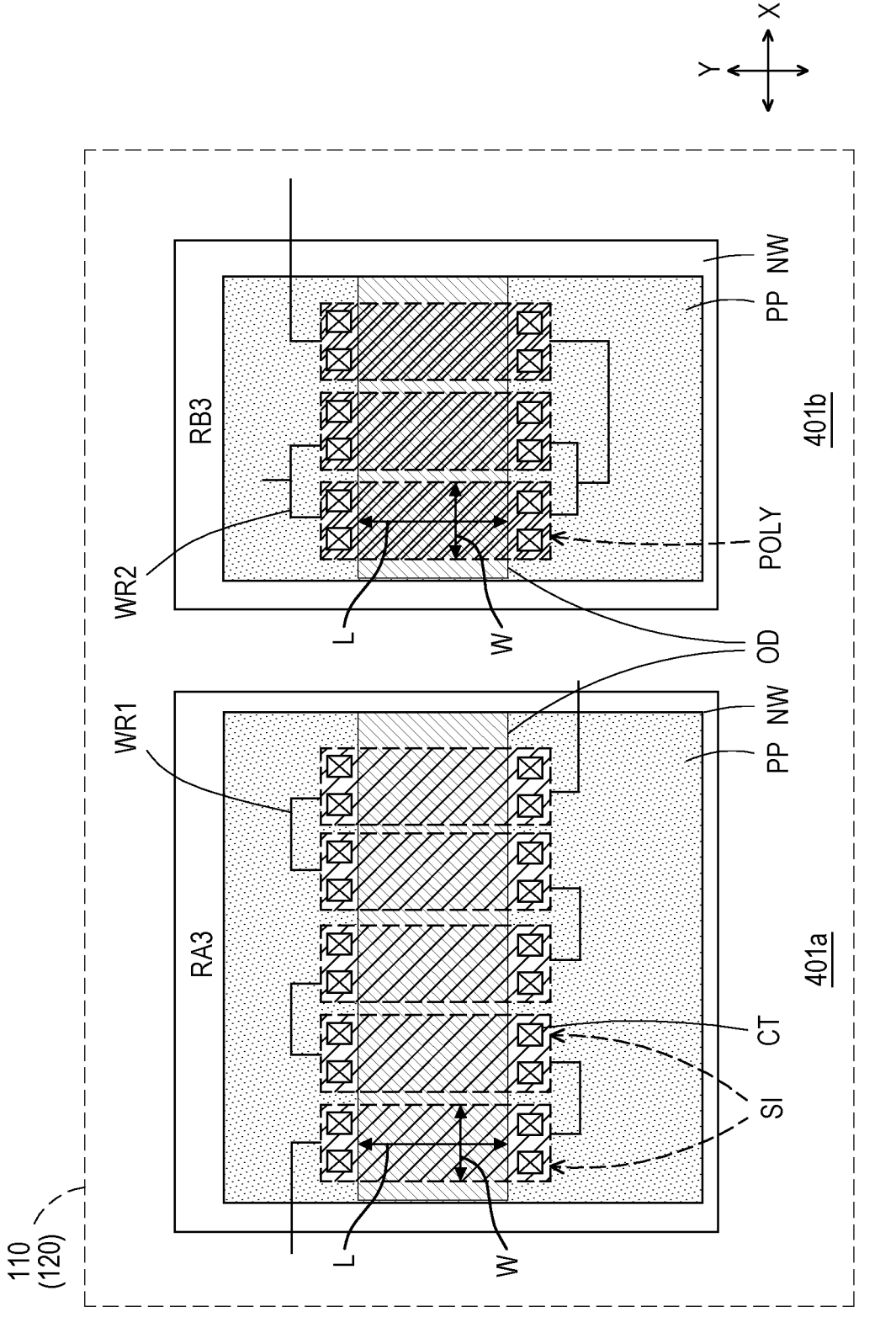
FIG. 4A illustrates a schematic top view of still another equivalent resistance layout of the sensors in accordance with some embodiments of the disclosure.
Figure 4D:
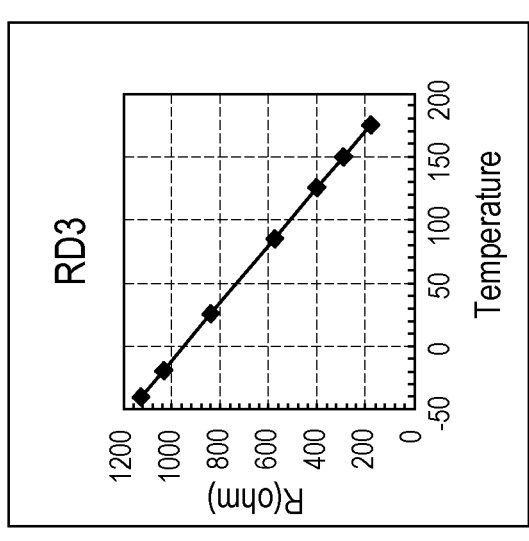
FIG. 4B to 4D respectively illustrate temperature resistance curves of the two types of the resistors, in accordance with some embodiments of the disclosure.
Figure 4C:
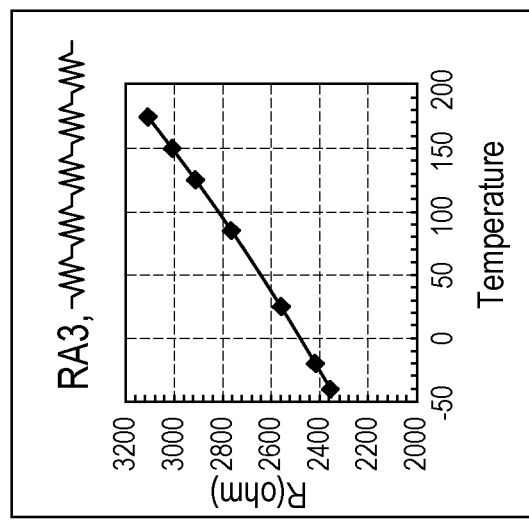
Figure 4B:
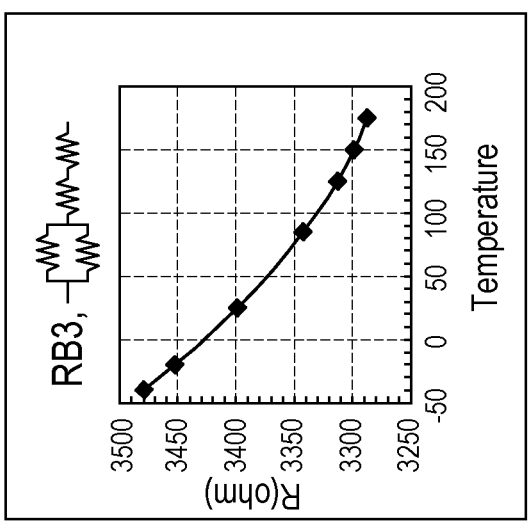

FIG. 4A illustrates a schematic top view of still another equivalent resistance layout of the sensors in accordance with some embodiments of the disclosure. FIG. 4B to 4D respectively illustrate temperature resistance curves of the two types of the resistors, in accordance with some embodiments of the disclosure.

Referring to FIG. 4A, similarly, in another embodiment, the sensor 110 and the sensor 120 both have at least two types of the equivalent resistances RA3 and RB3 introduced by the combinational circuits (not shown). In accordance with some embodiments, the combinational circuits may be equivalent to a plurality of resistor elements. The resistor elements may be electrically connected by the wires WR1, WR2 in the physical design layout 401a, 401b in various ways, for example, serially connected, parallel connected, or serial-parallel mixed connected. In some embodiments, the connected number of the resistor elements by the wires WR1, WR2 is not limited. For example, as shown in FIG. 4A to FIG. 4C, the equivalent resistance RA3 may have five resistor elements connected in series. The equivalent resistance RB3 may have four resistor elements that two of the resistors elements are connected in parallel, and the parallelly connected two resistors elements are connected to other serially connected two resistors elements in series. The equivalent resistance RA3 and the equivalent resistance RB3 are impedance matched under such connection layout structure in FIG. 4A. Therefore, the linear relationship of the resistance versus temperature curve is able to be achieved by subtracting the equivalent resistance RA3 from equivalent resistance RB3. Thus, the non-linear terms in the resistance versus temperature curve of the equivalent resistance RB3 and the equivalent resistance RA3 is able to be canceled. In other words, the resistance difference RD3 between the equivalent resistance RA3 and the equivalent resistance RB3 is linearly related to the temperature. For example, the sensor 110 (or the sensor 120) senses the equivalent resistance RA3 and the equivalent resistance RB3 of the combinational circuits, executes the subtracting operation, receives the resistance difference RD3, and transforms the resistance difference RD3 corresponding to the temperature into an output current. Further, the sensing circuit is able to receive the output current and determine the temperature according to the temperature-related resistance difference, wherein the resistance difference is linearly related to the temperature, making temperature detection easier and faster.

Referring to FIG. 4A, in some embodiments, the top view layout 401a of the first type resistor having the equivalent resistance RA3 and the top view layout 401b of the second type resistor having the equivalent resistance RB3 of the sensor 110 (or the sensor 120) are provided. The layout of the first type resistor 401a, having the first equivalent resistance RA3, may include an N-well region NW, a P-plus region PP, the silicide region SI, the oxide diffusion region OD, and a plurality of contact regions CT. The second type resistor, having the second equivalent resistance RB3, may include an N-well region NW, a P-plus region PP, the poly-silicon region POLY, the oxide diffusion region OD, and a plurality of contact regions CT. The equivalent resistance RA3 is electrically connected to a wire WR1 depicted in FIG. 4A, and the equivalent resistance RB3 is electrically connected to a wire WR2 depicted in FIG. 4A.

Referring to FIG. 4A, in some embodiments, a length L (for example, gate length) in the layout 401a may be substantially equal to 3.6 μm. A width W (for example, gate width) in the layout 301a may be substantially equal to 1.8 μm. A length L (for example, gate length) in the layout 301b may be substantially equal to 3.6 μm. A width W (for example, gate width) in the layout 201a may be substantially equal to 1.58 μm. However, the disclosure is not limited thereto. In some embodiments, by virtue of the width-over-length ratio (i.e., W/L) design in FIG. 4A, the equivalent resistance RA3 and the equivalent resistance RB3 are impedance matched, making the measured resistance difference less disturbed.

Referring to FIG. 4B to FIG. 4D, in some embodiments, a temperature resistance curve of the equivalent resistance RB3, a temperature resistance curve of the equivalent resistance RA3, and a temperature resistance curve of the resistance difference RD3 provided by subtracting the equivalent resistance RA3 from the equivalent resistance RB3 is provided. As shown in FIG. 4B to FIG. 4D, the temperature resistance curve of the equivalent resistance RB3 and the temperature resistance curve of the equivalent resistance RA3 are non-linear curves, for instance, quadratic curves. The order of the nonlinear curve is related to the characteristic of different kinds of resistors. However, in the temperature resistance curve of the resistance difference RD3, the resistance difference RD3 is linearly related to the temperature, so as the temperature detection can be easily determined by the linear equation of the linear curve. In some embodiments, the resistor structure of FIG. 4B is a negative temperature coefficient resistor, and the resistor structure of FIG. 4C is a positive temperature coefficient resistor, and the equivalent resistor structure of FIG. 4E is a negative temperature coefficient resistor. However, the disclosure is not limited thereto.

FIG. 5 illustrates a cross-sectional view of a semiconductor package in accordance with some embodiments.

Referring to FIG. 5, in some embodiments, the semiconductor package includes a plurality of semiconductor die 100 bonded to each other. In some embodiments, the semiconductor die 100 is mentioned above and thus has the substrate 102, the device layer 104 including the device 130, the sensors 110, 120 and the interconnect structure 140. In some embodiments, the device 130 and the sensors 110, 120 are transistors. The transistor may include a gate structure and source/drain regions located at two opposite sides of the gate structure, where the gate structure is formed on an n-well region (not shown), and the source/drain regions are formed in the n-well region. In one embodiment, the gate structure includes a gate electrode, a gate dielectric layer and a gate spacer. The gate dielectric layer may be disposed between the gate electrode and the substrate 102, and may or may not further cover a sidewall of the gate electrode. The gate spacer may laterally surround the gate electrode and the gate dielectric layer. In one embodiment, the source/drain regions include doped regions of p-type dopant that are formed in the n-well region by ion implantation. In an alternative embodiment, the source/drain regions include epitaxial structures formed in and protruding from a surface of the substrate 102, that are formed by epitaxial growth. However, the disclosure is not limited thereto. The device 130 and the sensors 110, 120 may have any other suitable structures. In addition, although the semiconductor dies 100 are illustrated as the same, the semiconductor dies 100 may have different structures.

In some embodiments, the semiconductor die 100 each further includes a plurality of bonding pads 162 in a dielectric layer 160, and the semiconductor dies 100 are bonded through the bonding pads 162 and the dielectric layers 160. In some embodiments, the semiconductor dies 100 are bonded through face-to-face bonding. In some embodiments, the bonding pads 162 are disposed on (e.g., in physical contact with) and electrically connected to the interconnect structure 140.

In some embodiments, after the semiconductor dies 100 are bonded, a redistribution layer structure 210, under bump metallization pads 220 and bumps 230 are formed over the stacked semiconductor dies 100. The redistribution layer structure 210 includes at least one polymer layer and conductive features embedded by the polymer layer. The conductive features include metal pads, metal lines and/or metal vias configured to electrically connect to different components. In some embodiments, the polymer layer may include a photo-sensitive material such as polybenzoxazole (PBO), polyimide (PI), benzocyclobutene (BCB), a combination thereof or the like. The polymer layer of the redistribution layer structure 210 may be replaced by a dielectric layer or an insulating layer as needed. In some embodiments, the conductive features may include Cu, Ti, Ta, W, Ru, Co, Ni, a combination thereof or the like. In some embodiments, a seed layer and/or a barrier layer may be disposed between each metal feature and the polymer layer. The seed layer may include Ti/Cu. The barrier layer may include Ta, TaN, Ti, TiN, CoW or a combination thereof. The under bump metallization pads 220 are disposed over and electrically connected to the redistribution layer structure 210. The under bump metallization pads 220 may include Cu, Ti, Ta, W, Ru, Co, Ni, a combination thereof or the like. In some embodiments, a seed layer and/or a barrier layer may be disposed between each under bump metallization pad and the polymer layer. The seed layer may include Ti/Cu. The barrier layer may include Ta, TaN, Ti, TiN, CoW or a combination thereof.

The bumps 230 are disposed over and electrically connected to the under bump metallization pads and therefore the redistribution layer structure 210. In some embodiments, the bumps 230 include copper, solder, nickel or a combination thereof. In some embodiments, the bumps 230 may be solder balls, controlled collapse chip connection (C4) bumps, ball grid array (BGA) balls, micro bumps, electroless nickel-electroless palladium-immersion gold technique (ENEPIG) formed bumps, cupper pillar, hybrid bonding bumps, or the like.

Referring to FIG. 5, the sensor 110 is disposed in the first region 100A (i.e., isolation region) of the stacked semiconductor die 100. The sensor 120 and the device 130 are disposed in the second region 100B (i.e., device region or dense region) of the stacked semiconductor die 100. In some embodiments, the device region refers to as the region that the target sensor is aside by the logic device. In some embodiments, the sensor 110 disposed in the first region 100A may be a reference sensor. The sensor 110 is able to sense two types of the equivalence resistances of the resistor elements introduced by the combinational circuits at ambient (or background) temperature, for example, the temperature of the first region 100A of the device layer 104 or the room temperature. In some embodiments, the sensor 120 disposed in the second region 100B may be a target sensor or device sensor. The sensor 120 is able to sense two types of the equivalence resistances of the resistor elements introduced by the combinational circuits that is influenced or fluctuated by the device 130 at certain operation temperature when the device 130 are in active mode or work mode. The sensor 110, 120 may subtract the measured resistance (non-linearly related to the temperature) of the first type resistor (e.g., including poly-Si material) from the measured resistance (non-linearly related to the temperature) of the second type resistor (e.g., including silicide material) and then generate a resistance difference, wherein the resistance difference is linearly related to the temperature. In addition, the corresponding temperature is able to be determined by using the linear curve interpolation formula.

In some embodiments, the distance between the sensor 110 and the logic device 130 is larger than 2 μm. Therefore, the ambient temperature sensed by the sensor 110 will not be influenced or disturbed. In some embodiments, the distance between the sensor 120 and the logic device 130 is smaller than 1 μm. Therefore, the uprising temperature of the logic device 130 may influence the two types of the in-situ resistors of the sensor 120 (the equivalent resistance will be changed as the temperature is fluctuated) while the logic device 130 is in active operation mode. The sensed resistances of the two types of resistors may be processed (i.e., subtracted) by the sensor 120 and then the subtraction result of the resistance difference may be transformed to a temperature-related current. The sensing circuit may receive the temperature-related current from the sensor 120 and compare with the output current according to the background temperature from the sensor 110. When the compared result is not accepted or not in a predetermined temperature range, the device may be overheating. The sensing circuit may be electrically connected to the target (device) sensor 120 in the first fie 100, the sensor 120 in the second die 100, and the reference sensor 110 in the first die 100 or the second die 100. In some embodiments, the sensing circuit is configured to compare the device temperature in the stacked dies 100 and the ambient temperature in the stacked dies 100 and compare the device temperature in the second die 100 and the ambient temperature in the stacked dies 100. The device temperature may be the temperature of forming any layer of the stacked semiconductor dies or the temperature during bonding the semiconductor dies.

FIG. 6 illustrates a flowchart of a method of determining a temperature of a semiconductor device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S302, a first die is provided, and the first die includes a first sensor and a second sensor. The first die may include at least one first semiconductor device and a first sensor aside the at least one first semiconductor device. The first sensor includes a first resistor with a first non-linear temperature resistance curve and a second resistor with a second non-linear temperature resistance curve. The first resistance difference is linearly related to a first device temperature of the at least one first semiconductor device At act S304, a first resistance of a first resistor and a second resistance of a second resistor are sensed.

At act S306, the first resistance of the first resistor is subtracted from the second resistance of the second resistor to obtain a first resistance difference, wherein the first resistance difference is linearly related to a first device temperature of the at least one first semiconductor device.

At act S308, the first device temperature of the at least one first semiconductor device is compared with a predetermined temperature.

At act S310, a feedback signal is outputting when the first device temperature is larger than the predetermined temperature. The feedback signal may be outputted to a temperature related controller and provides thermal information or the system, so as to lower the process temperature or provide heat dissipation to lower the temperature of the semiconductor device.

FIG. 7 illustrates a flowchart of a method of determining a temperature of a semiconductor device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S402, a die is provided, the die includes a semiconductor device, a target sensor aside the semiconductor device and a reference sensor. The target sensor includes a first resistor with a first non-linear temperature resistance curve and a second resistor with a second non-linear temperature resistance curve, and the reference sensor includes a third resistor with the first non-linear temperature resistance curve and a fourth resistor with the second non-linear temperature resistance curve. A first resistance difference between the first and second resistors is linearly related to a first device temperature of the at least one first semiconductor device (such as a temperature of the device region of the device layer). Similarly, a second resistance difference between the third and fourth resistors is linearly related to an ambient temperature (such as a temperature of the isolation region of the device layer).

At act S404, a first resistance of the first resistor and a second resistance of the second resistor are sensed, and a third resistance of the third resistor and a fourth resistance of the fourth resistor are sensed.

At act S406, the first resistance is subtracted from the second resistance to obtain a first resistance difference, and the third resistance is subtracted from the fourth resistance to obtain a second resistance difference, wherein the first resistance difference is linearly related to a device temperature of the semiconductor device, and the second resistance difference is linearly related to an ambient temperature.

At act S408, the device temperature and the ambient temperature are compared to obtain a temperature difference.

At act S410, a feedback signal is outputting when the temperature difference is larger than the predetermined value.

In some alternative embodiments, the semiconductor devices and their modifications independently are referred to as a semiconductor die, a semiconductor chip, a semiconductor integrated circuit (IC), or the like. On the other hand, for example, the sensor independently is referred to as a sensing element or a vertical (sensing) transistor while the reference sensor independently is referred to as a reference element or a vertical (reference) transistor or circuit. The disclosure is not limited thereto. A number of sensor or sensor device being independently or dependently operated with one another may be one or multiple, the disclosure is not limited thereto. In embodiments of the multiple sensors or sensor devices are employed, the types and/or arrangement of the sensor components of the multiple sensors or sensor devices may be different, in part or all. Or, in embodiments of the multiple sensors or sensor devices are employed, the types and/or arrangement of the sensor components of the multiple sensor or sensor device may be substantially identical to one another. The number of the sensors or sensor devices included in one semiconductor device may be selected and designed based on the demand and design requirements. In the disclosure, positioning locations of the sensor and the reference are interchangeable. The disclosure is not limited thereto.

In accordance with some embodiments, a semiconductor device includes a first substrate and a first device layer. The first device layer is disposed on the first substrate and includes at least one first device and a sensor aside the at least one first device. The sensor includes a first resistor with a first non-linear temperature resistance curve and a second resistor with a second non-linear temperature resistance curve. A temperature of the sensor is linearly related to a difference between a first resistance of the first resistor at the temperature and a second resistance of the second resistor at the temperature.

In accordance with some embodiments, a semiconductor device includes a first die having a device region and an isolation region. The first die includes at least one first device in the device region, a first sensor in the device region, and a reference sensor in the isolation region. The first sensor is able to sense a first device temperature of the at least one first device. The first sensor includes a first resistor with a first non-linear temperature resistance curve and a second resistor with a second non-linear temperature resistance curve. The first device temperature is linearly related to a difference between a first resistance of the first resistor at the first device temperature and a second resistance of the second resistor at the first device temperature. The reference sensor is able to sense an ambient temperature. The reference sensor includes a third resistor with the first non-linear temperature resistance curve and a fourth resistor with the second non-linear temperature resistance curve. The ambient temperature is linearly related to a difference between a third resistance of the third resistor at the ambient temperature and a fourth resistance of the fourth resistor at the ambient temperature.

In accordance with some embodiments, a method of determining a temperature of a semiconductor device includes providing a first die, sensing a first resistance of the first resistor and a second resistance of the second resistor, and subtracting the first resistance of the first resistor from the second resistance of the second resistor to obtain a first resistance difference. The first die includes at least one first device and a first sensor aside the at least one first device. The first sensor includes a first resistor with a first non-linear temperature resistance curve and a second resistor with a second non-linear temperature resistance curve. The first resistance difference is linearly related to a first device temperature of the at least one first device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first substrate; and
a first device layer, disposed on the first substrate, comprising:
    at least one first device; and
    a sensor aside the at least one first device, comprising:
        a first resistor with a first non-linear temperature resistance curve and a first gate length; and
        a second resistor with a second non-linear temperature resistance curve and a second gate length,
    wherein a temperature of the sensor is linearly related to a difference between a first resistance of the first resistor at the temperature and a second resistance of the second resistor at the temperature, and
the first gate length is larger than the second gate length.

2. The semiconductor device as claimed in claim 1, wherein the first resistor is a positive temperature coefficient resistor, and the second resistor is a negative temperature coefficient resistor.

3. The semiconductor device as claimed in claim 1, wherein the first non-linear temperature resistance curve and the second non-linear temperature resistance curve are respectively a quadratic curve.

4. The semiconductor device as claimed in claim 1, further comprising a sensing circuit, wherein the first resistor and the second resistor are respectively electrically connected to the sensing circuit.

5. The semiconductor device as claimed in claim 4, wherein the sensing circuit is configured to detect a current drop from the sensor while the at least one first device is in an active mode.

6. The semiconductor device as claimed in claim 1, wherein a plurality of first resistor elements of the first resistor and a plurality of second resistor elements of the second resistor are arranged in series or in parallel respectively.

7. A semiconductor device, comprising:
a first die having a device region and an isolation region, comprising:
    at least one first device in the device region, wherein the at least one first device comprises an integrated circuit or a logic device;
    a first sensor in the device region, configured to sense a first device temperature of the at least one first device, comprising a first resistor with a first non-linear temperature resistance curve and a second resistor with a second non-linear temperature resistance curve, wherein the first device temperature is linearly related to a difference between a first resistance of the first resistor at the first device temperature and a second resistance of the second resistor at the first device temperature; and
    a reference sensor in the isolation region, configured to sense an ambient temperature, comprising a third resistor with the first non-linear temperature resistance curve and a fourth resistor with the second non-linear temperature resistance curve, wherein the ambient temperature is linearly related to a difference between a third resistance of the third resistor at the ambient temperature and a fourth resistance of the fourth resistor at the ambient temperature.

8. The semiconductor device as claimed in claim 7, further comprising:
a sensing circuit, configured to compare a first current outputted from the first sensor and a second current outputted from the reference sensor, wherein a compared result outputted from the sensing circuit determines whether the at least one first device is overheating.

9. The semiconductor device as claimed in claim 7, wherein the first resistor and the third resistor are respectively a positive temperature coefficient resistor, and the second resistor and the fourth resistor are respectively are respectively a negative temperature coefficient resistor.

10. The semiconductor device as claimed in claim 7, wherein the third resistor is the same as the first resistor, and the fourth resistor is the same as the second resistor.

11. The semiconductor device as claimed in claim 7, wherein a distance between the reference sensor and the at least one first device is larger than a distance between the first sensor and the at least one first device.

12. The semiconductor device as claimed in claim 7, further comprising a second die bonded to the first die, wherein the second die comprises:
at least one second device; and
a second sensor aside the at least one second device, configured to sense a second device temperature of the at least one second device, comprising a fifth resistor with a third non-linear temperature resistance curve and a sixth resistor with a fourth non-linear temperature resistance curve, wherein the second device temperature is linearly related to a difference between a fifth resistance of the fifth resistor at the second device temperature and a sixth resistance of the sixth resistor at the second device temperature.

13. The semiconductor device as claimed in claim 12, further comprising a sensing circuit electrically connected to the first sensor, the second sensor and the reference sensor.

14. The semiconductor device as claimed in claim 13, wherein the sensing circuit is configured to compare the first device temperature and the ambient temperature and compare the second device temperature and the ambient temperature.

15. A method of determining a temperature of a semiconductor device, comprising:
providing a first die, the first die comprising:
    at least one first device, wherein the at least one first device comprises an integrated circuit or a logic device; and
    a first sensor aside the at least one first device, comprising a first resistor with a first non-linear temperature resistance curve and a second resistor with a second non-linear temperature resistance curve;
sensing a first resistance of the first resistor and a second resistance of the second resistor;
subtracting the first resistance of the first resistor from the second resistance of the second resistor to obtain a first resistance difference, wherein the first resistance difference is linearly related to a first device temperature of the at least one first device; and
sensing an ambient temperature through a reference sensor, wherein a distance between the reference sensor and the at least one first device is larger than a distance between the first sensor and the at least one first device.

16. The method of claim 15, wherein the first resistor is a positive temperature coefficient resistor, and the second resistor is a negative temperature coefficient resistor.

17. The method of claim 15, further comprising:

comparing the first device temperature of the at least one first device with a predetermined temperature; and outputting a feedback signal when the first device temperature is larger than the predetermined temperature.

18. The method of claim 15, further comprising:

sensing a third resistance of a third resistor of the reference sensor and a fourth resistance of a fourth resistor of the reference sensor, wherein the third resistor has the first non-linear temperature resistance curve and the fourth resistor has the second non-linear temperature resistance curve; and subtracting the third resistance of the third resistor from the fourth resistance of the fourth resistor to obtain a second resistance difference, wherein the resistance difference is linearly related to the ambient temperature.

19. The method of claim 18, further comprising:

comparing the first device temperature of the at least one first device with the ambient temperature to obtain a temperature difference; and outputting a feedback signal to the sensing circuit when the temperature difference is larger than a predetermined value.

20. The method of claim 15, further comprising bonding the first die to a second die, wherein sensing the first resistance of the first resistor and the second resistance of the second resistor is performed during bonding the first die to the second die.

\*    \*    \*    \*    \*